(12) United States Patent
Umemoto et al.

(10) Patent No.: US 7,771,701 B2
(45) Date of Patent: Aug. 10, 2010

(54) HYDROGEN ATOM GENERATION SOURCE IN VACUUM TREATMENT APPARATUS, AND HYDROGEN ATOM TRANSPORTATION METHOD

(75) Inventors: Hironobu Umemoto, Nomi (JP); Atsushi Masuda, Nomi (JP); Koji Yoneyama, Nomi (JP); Keiji Ishibashi, Kawasaki (JP); Manabu Ikemoto, Kawasaki (JP)

(73) Assignee: Canon Anelva Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 11/816,726

(22) PCT Filed: Jul. 15, 2005

(86) PCT No.: PCT/JP2005/013175

§ 371 (c)(1),
(2), (4) Date: Jul. 24, 2008

(87) PCT Pub. No.: WO2006/087833

PCT Pub. Date: Aug. 24, 2006

(65) Prior Publication Data

US 2009/0004100 A1    Jan. 1, 2009

(30) Foreign Application Priority Data

Feb. 21, 2005    (JP) .............................. 2005-044413

(51) Int. Cl.
*C01B 3/02* (2006.01)
*B01J 19/02* (2006.01)
*B05D 7/22* (2006.01)
*C23C 16/22* (2006.01)

(52) U.S. Cl. ................... 423/648.1; 422/240; 427/230; 427/236; 427/255.28

(58) Field of Classification Search ............. 423/648.1, 423/644; 154/345, 345.1; 502/53; 422/240; 427/230, 236, 255.28
See application file for complete search history.

(56) References Cited

U.S. PATENT DOCUMENTS 5,885,361 A    3/1999    Kikuchi et al.

(Continued)

FOREIGN PATENT DOCUMENTS

JP    06-140368    5/1994

(Continued)

OTHER PUBLICATIONS

Otsuka et al. "Hydrogen dissociation on hot tantalum and tungsten filaments under diamond deposition conditions", Jan. 15, 1995, J. Appl. Phys, 77 (2), p. 893-898.*

(Continued)

*Primary Examiner*—Wayne Langel
*Assistant Examiner*—Syed Iqbal
(74) *Attorney, Agent, or Firm*—Buchanan Ingersoll & Rooney PC

(57) ABSTRACT

In a hydrogen atom generation source in a vacuum treatment apparatus which can effectively inhibit hydrogen atoms from being recombined due to contact with an internal wall surface of a treatment chamber of the vacuum treatment apparatus and an internal wall surface of a transport passage, and being returned into hydrogen molecules, at least a part of a surface facing a space with the hydrogen atom generation source formed therein of a member surrounding the hydrogen atom generation source is coated with $SiO_2$. In a hydrogen atom transportation method for transporting hydrogen atoms generated by the hydrogen atom generation source in the vacuum treatment apparatus to a desired place, the hydrogen atoms are transported via a transport passage whose internal wall surface is coated with $SiO_2$.

2 Claims, 4 Drawing Sheets

U.S. PATENT DOCUMENTS

| | | | | | |
|---|---|---|---|---|---|
| 6,007,671 | A | * | 12/1999 | Fujimura et al. | 156/345.27 |
| 6,869,585 | B2 | * | 3/2005 | Otsuka et al. | 423/651 |
| 2002/0123206 | A1 | * | 9/2002 | Hong et al. | 438/424 |

FOREIGN PATENT DOCUMENTS

| | | |
|---|---|---|
| JP | 08-037176 | 2/1996 |
| JP | 2002-294451 | 10/2002 |

OTHER PUBLICATIONS

International Search Report issued in corresponding PCT Application No. PCT/JP2005/0163176.

Patrick Kae-Nune et al., "Surface recombination probabilities of H on stainless steel, a-Si:H and oxidized silicon determined by threshold ionization mass spectrometry in $H_2$ RF discharges", Surface Science 360 (1996), pp. 495-498.

Hironobu Umemoto et al., Direct detection of H atoms in the catalytic chemical vapor deposition of the $SiH_4/H_2$ system, Journal of Applied Physics, vol. 91, No. 3, Feb. 1, 2002, pp. 1650-1656.

A. Rousseau et al., "Microwave discharge in $H_2$: influence of H-atom density on the power balance", J. Phys. vol. D27, pp. 1412-1422 (1994).

* cited by examiner

● STAINLESS STEEL (WITHOUT $SiO_2$ COATING)

○ FLUORINE RESIN (TEFLON (REGISTERED TRADE MARK)) COATING

■ $SiO_2$ COATING

□ $H_3PO_4$ COATING ON $SiO_2$ COATING

HYDROGEN ATOM GENERATION SOURCE IN VACUUM TREATMENT APPARATUS, AND HYDROGEN ATOM TRANSPORTATION METHOD

TECHNICAL FIELD

The disclosure relates to a hydrogen atom generation source in a vacuum treatment apparatus and a hydrogen atom transportation method. Particularly, the disclosure relates to a hydrogen atom generation source which can effectively inhibit hydrogen atoms generated by a hydrogen atom generation means in a vacuum treatment apparatus from being recombined and returning into hydrogen molecules and thus attenuating hydrogen atom density, and the method for inhibiting the attenuation of the density of the hydrogen atoms generated by the hydrogen atom generation source and simultaneously transporting the hydrogen atoms to a desired position.

BACKGROUND ART

A chemical vapor deposition (CVD) method is widely used as one process for forming a predetermined thin film on a substrate in creation of various semiconductor devices including LSI (large-scale integration) and of LCD (liquid crystal display).

Hydrogen atoms are widely used for the CVD method and also for terminals of dangling-bond in polysilicon, dry etching of crystalline silicon, cleaning of an evacuation enabled treatment chamber, and photoresist removal. In these methods, hydrogen atoms play an important part as an effective etching seed.

However, since hydrogen atoms contact with an internal wall of a treatment chamber in a vacuum treatment apparatus so as to be recombined and returned to hydrogen molecules, even if the hydrogen atoms are generated efficiently, it is difficult to maintain the density of the hydrogen atoms and transport them to a target position.

For example, it is reported that the extinction probability of hydrogen atoms on a surface of stainless steel is 0.20, and 90% of the hydrogen atoms are extinct the hydrogen atoms collide with the surface of the stainless steel ten times (non-patent document 1).

In a vacuum treatment apparatus which forms a thin film and modifies the property of the formed thin film in an evacuated treatment chamber, even if hydrogen atoms are tried to be used for the aforementioned various applications, the density of the hydrogen atoms is greatly attenuated, and thus it is difficult to provide the hydrogen atoms to practical uses.

Conventionally, it is proposed that a water cooling glass chamber is used as the treatment chamber in the vacuum treatment apparatus, and thus recombining and returning of hydrogen atoms into hydrogen molecules can be inhibited. However, even if this method is used, when the temperature of the internal wall of the chamber rises due to heat emission from a structure for heating a substrate arranged in the treatment chamber of the vacuum treatment apparatus, the recombining process is accelerated, and the attenuation of the hydrogen atom density proceeds (non-patent document 2). In the case where a certain heat source is present in the treatment chamber in order to heat a substrate, the hydrogen atom density is more likely to be attenuated.

On the other hand, it is known that hydrogen atoms can be generated efficiently by decomposition of hydrogen molecules on the surface of a high-temperature metallic catalyst (non-patent document 3).

As the vacuum treatment apparatus, therefore, a raw material gas supply system for supplying a raw material gas into a water cooling glass chamber and a heat generator (metallic catalyst) which is arranged in the water cooling glass chamber and is heated to a high temperature upon supply of an electric power from an electric power supply mechanism are provided. A hydrogen gas introduced from the raw material gas supply system into the water cooling chamber is decomposed by a heat generator maintained at high temperature so that hydrogen atoms are generated efficiently and are used for the various applications.

However, even if the water cooling glass chamber is used in order to inhibit the attenuation of the hydrogen atom density, since the glass chamber naturally requires mechanical strength (for example, a pressure due to a pressure difference between vacuum and air, water pressure of cooling water), it requires a certain thickness. Glass is known as a material whose heat conductivity is low, and when it has a certain thickness in order to satisfy the above mechanical strength, in the case where hydrogen atoms are generated by a high-temperature heat generator (metallic catalyst), for example, the temperature of the surface of the chamber internal wall inevitably rises even if the chamber is cooled by water. When the temperature of the chamber internal wall rises in such a manner, the recombining process is accelerated, and the attenuation of the hydrogen atom density proceeds. For this reason, even if hydrogen molecules are decomposed on the surface of the high-temperature metallic catalyst and hydrogen atoms are generated efficiently, it is difficult to provide the hydrogen atoms to practical uses.

When the glass chamber is used as the evacuation enabled treatment chamber in the vacuum treatment apparatus for forming a thin film, modifying the property of a formed thin film, removing photoresist and cleaning, this has great technical difficulty that a substrate size should be enlarged.

Non-patent document 1: P. Kae-Nune, J. Perrin, J. Jolly, and J. Guillon, Surf. Sci. 360, L495 (1996)

Non-patent document 2: J. Phys. vol. D27, page 1412 (1994)

Non-patent document 3: J. Appl. Phys. vol. 91, No. 3, page 1650 (2002)

OBJECT AND SUMMARY

In view of the conventional technique, it is an object of the disclosure to propose a hydrogen atom generation source in a vacuum treatment apparatus which can effectively inhibit hydrogen atoms used for various practical applications in various surface treatments such as a CVD method from being recombined and returned into hydrogen molecules due to contact with an internal wall surface of a treatment chamber in the vacuum treatment apparatus and an internal wall surface of a transport passage and can transport the hydrogen atoms, and a hydrogen atom transportation method.

In order to achieve the above object, a hydrogen atom generation source in a vacuum treatment apparatus, according to one aspect of the present invention, comprises a hydrogen atom generation means, and a member surrounding said hydrogen atom generation means, wherein at least a part of a surface of said member facing a space in which said hydrogen atom generation means is arranged is coated with $SiO_2$.

In one case, the hydrogen atom generation source has a transport passage through which hydrogen atoms generated by the hydrogen atom generation means are transported out of the hydrogen atom generation source, and an internal wall surface of the transport passage is coated with $SiO_2$. In order to achieve the above object, a hydrogen atom generation means is in a vacuum treatment apparatus. At least a part of a surface of a member facing the hydrogen atom generation means faces a space with the hydrogen atom generation source arranged therein, and is coated with $SiO_2$.

According to an experiment by the inventors, in the case where the surface facing the space with the hydrogen atom generation source arranged therein of the member surrounding the hydrogen atom generation source is coated with $SiO_2$, absolute density of the hydrogen atoms is one digit larger than that in a case with the same condition except that the surface is not coated with $SiO_2$.

In one embodiment, the hydrogen atom generation means is surrounded by the member, and a surface of said member facing a space in which said hydrogen atom generation means is arranged is coated with $SiO_2$. And, the internal wall surface of the transport passage through which the hydrogen atoms generated by the hydrogen atom generation means are transported out of the hydrogen atom generation source is coated with $SiO_2$. As a result, the hydrogen atoms are effectively inhibited from being recombined and returned into hydrogen molecules. As a result, the hydrogen atoms are effectively inhibited from being recombined and returned into hydrogen molecules. As a result, a high density of the hydrogen atoms is maintained, the hydrogen atoms are transported to a target place and thus can be effectively used for an interface stabilizing technique for a terminal of dangling bond in polysilicon and a semiconductor apparatus.

The surface facing the space with the hydrogen atom generation means arranged therein of the member surrounding the hydrogen atom generation means is not always entirely coated with $SiO_2$. Only a part of the surface, such as a portion which is close to the hydrogen atom generation means, may be coated with $SiO_2$ as long as the hydrogen atoms can be effectively inhibited from being recombined and returned into hydrogen molecules and the high density of the generated hydrogen atoms can be maintained.

In the hydrogen atom generation source in the vacuum treatment apparatus of an embodiment of the present invention, a high-temperature metallic catalyst on the surface of which can decompose hydrogen molecules so as to generate hydrogen atoms, such as a metallic catalyst in a catalytic-CVD (cat-CVD) apparatus, for example, can be adopted as the hydrogen atom generation means.

It is clarified in non-patent document 3 that hydrogen atoms can be effectively generated by decomposing hydrogen molecules on the surface of the high-temperature metallic catalyst. For example, a raw material gas supply system which supplies a raw material gas to an evacuation enabled treatment chamber, and a heat generator (metallic catalyst) which is arranged in the treatment chamber and is heated to high temperature upon supply of an electric power from an electric power supply mechanism are provided. A raw material gas introduced into the treatment chamber in a predetermined vacuum state from the raw material gas supply system is decomposed and/or activated by the heat generator (metallic catalyst) maintained at high temperature, and hydrogen atoms can be efficiently generated by using the heat generator (metallic catalyst) in the catalytic-CVD (Cat-CVD) apparatus for executing a predetermined process on a substrate to be treated arranged in the treatment chamber, and by using hydrogen gas as the raw material gas. The hydrogen atoms with high density generated in such a manner can be effectively used for the interface stabilizing process for a terminal of dangling bond in polysilicon and a semiconductor apparatus in the catalytic-CVD apparatus.

One embodiment of the present invention is applied to a heat generator CVD apparatus, particularly to a catalytic-CVD (Cat-CVD) apparatus, and hydrogen atoms can be efficiently generated on the surface of the high-temperature metallic catalyst by decomposing hydrogen molecules (non-patent document 3). For this reason, when the embodiment of the present invention is used for the catalytic-CVD apparatus and a catalytic-CVD method, the attenuation of the hydrogen atom density in the evacuation enabled treatment chamber and the transport passage in the vacuum treatment apparatus is effectively inhibited, so that the large amount of hydrogen atoms with high density can be used.

It is desirable that the member surrounding the hydrogen atom generation means is made of metal, and has a cooling system.

In this case, it is desirable that the temperature of the surface facing a space with the hydrogen atom generation means arranged therein of the member surrounding the hydrogen atom generation means made of metal is maintained at +30° C. or less by the cooling system.

According to an experiment by the inventors, the temperature of the member surrounding the hydrogen atom generation means also influences the attenuation of the hydrogen atom density. In the case where the member surrounding the hydrogen atom generation means is made of metal and has the cooling system, when the surface facing the space with the hydrogen atom generation means arranged therein in the member surrounding the hydrogen atom generation means is coated with $SiO_2$, the attenuation of the hydrogen atom density can be inhibited more effectively.

In this case, as the member surrounding the hydrogen atom generation means made of metal, stainless steel or aluminum can be used.

As the cooling system, a publicly-known system in this technical field such as a mechanism which prevents a rise in temperature due to a heat radiated from the heat generator mounted to the heat generator CVD apparatus so as to maintain predetermined temperature can be adopted. For example, a system which flows a cooling medium in the member surrounding the hydrogen atom generation means so as to cool the member can be adopted.

According to an experiment by the inventors, when the temperature of the surface facing the space with the hydrogen atom generation means arranged therein of the member surrounding the hydrogen atom generation means exceeds +30° C., the hydrogen atom density reduces. It is, therefore, desirable that the surface temperature is +30° C. or less. It is desirable for effectively restraining the attenuation of the hydrogen atom density and practical use of the hydrogen atoms that the surface temperature is maintained within a range of −30° C. to +30° C.

In the present invention, the $SiO_2$ coating can be formed by applying an organic solvent solution of polysilazane and oxidizing the solution. For example, a xylene solution of perhydropolysilazane is applied and is naturally oxidized so that the $SiO_2$ coating can be formed.

As the $SiO_2$ coating, porous $SiO_2$ which is formed by executing a plasma oxidizing process on hydrogenated amorphous silicon can be adopted. According to an experiment by the inventors, however, surface roughness of the internal wall of the treatment chamber influences the attenuation of the hydrogen atom density, and it is desirable that the $SiO_2$ coating whose surface is flat and smooth is formed by the applying process.

After the organic solvent solution of polysilazane is applied to the internal wall surface of the treatment chamber, the solution is oxidized at temperature of, for example, 600 K or less, so that the internal wall surface of the treatment chamber can be coated with $SiO_2$ in a flat and smooth state.

In order to achieve the object, the embodiment of the present invention provides a hydrogen atom transportation method in a vacuum treatment apparatus for transporting hydrogen atoms generated by a hydrogen atom generation means in a vacuum treatment apparatus to a desired place, wherein the hydrogen atoms are transported via a transport passage whose internal wall surface is coated with $SiO_2$.

According to this transportation method, since the internal wall surface of the transport passage is coated with $SiO_2$, the hydrogen atoms can be effectively inhibited from being recombined in the transport passage and returned into hydrogen molecules. Therefore, the high density of the hydrogen atoms is maintained, and the hydrogen atoms are transported to a target place so as to be capable of being used for the interface stabilizing technique for a terminal of dangling bond in polysilicon and a semiconductor apparatus.

In the transportation method, at least a part of the surface facing the space with the hydrogen atom generation means arranged therein of the member surrounding the hydrogen atom generation means is coated with $SiO_2$, and the member surrounding the hydrogen atom generation means is made of metal and has the cooling system. As a result, the attenuation of the hydrogen atom density at a process for transporting the hydrogen atoms can be restrained more effectively.

According to the disclosure, hydrogen atoms which are used for various practical applications in various surface treatments such as the CVD method are effectively inhibited from being recombined due to contact with the surface facing the space with the hydrogen atom generation means arranged therein of the member surrounding the hydrogen atom generation means and the internal wall surface of the transport passage for transporting the hydrogen atoms to a place to be used for predetermined treatment, and from being returned into hydrogen molecules.

As a result, the hydrogen atoms with desired high density are efficiently transported to a target place with the high density being maintained, and can be effectively used for the interface stabilizing technique for a terminal of dangling bond in polysilicon and a semiconductor apparatus.

BRIEF DESCRIPTION OF THE DRAWINGS

FIG. 4 is an SEM image of an $SiO_2$ film surface before and after the experiment.

DETAILED DESCRIPTION OF THE PREFERRED EMBODIMENTS

An exemplary embodiment of the present invention is described below with reference to accompanying drawings.

Figure 1:
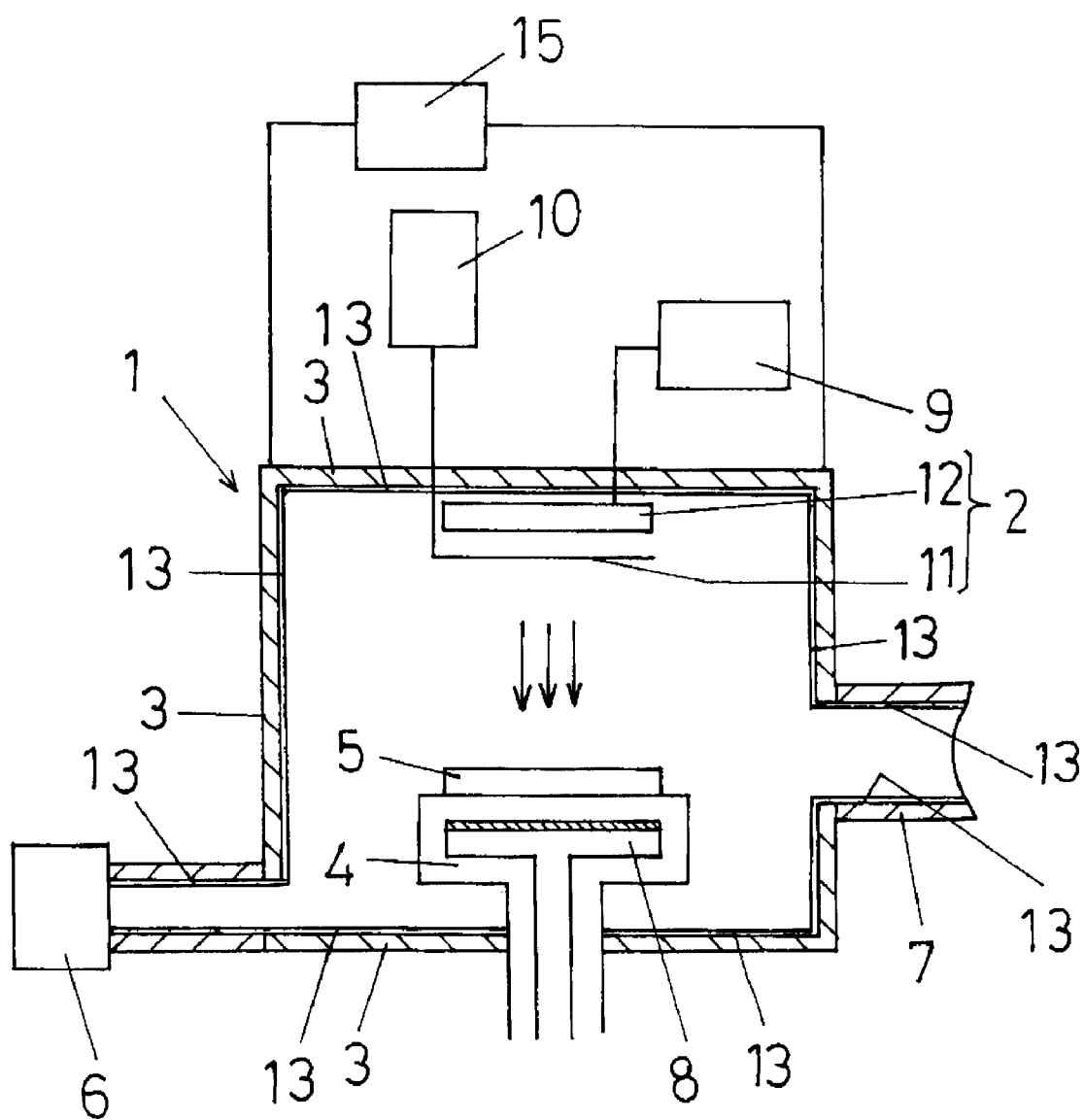
FIG. 1 is a schematic constitutional diagram explaining one embodiment realized in a catalytic-CVD apparatus.

FIG. 1 is a schematic diagram illustrating one example where a hydrogen atom generation source in a vacuum treatment apparatus and a hydrogen atom transportation method are realized in a catalytic-CVD (Cat-CVD) apparatus.

A catalytic-CVD apparatus 1 shown in FIG. 1 has a hydrogen atom generation means 2 which generates hydrogen atoms, and a treatment chamber 3 which is exhausted to a predetermined vacuum. A substrate holder 4 is disposed in the treatment chamber 3, and a substrate 5 to be treated which is subject to an interface stabilizing process for a terminal of a dangling bond in polysilicon or a semiconductor apparatus is mounted onto the substrate holder 4. The treatment chamber 3 is connected to a pressure reducing means 6 such as an air exhaust device which reduces a pressure in the treatment chamber 3, and a connecting section 7 which conveys the substrate 5 to be treated from another treatment chamber via a gate valve, not shown. The substrate holder 4 includes a heating means 8 such as a heater so that the substrate 5 to be treated which is mounted onto the substrate holder 4 can be heated.

A form of the substrate holder 4 is not particularly limited, and thus the substrate holder 4 may hold a plurality of substrates simultaneously. A holding direction of the substrate 5 to be treated is not limited to a horizontal direction like the drawing, and may be a vertical direction.

The treatment chamber 3 is provided with a raw material gas supply system 9 which supplies a raw material gas into the treatment chamber 3, and a heat generator 11 which is arranged in the treatment chamber 3, and is heated to high temperature upon supply of an electric power from an electric power supply system 10.

A raw material gas supplied from the raw material gas supply system 9 blows off from a raw material gas blow-off device 12, which has a lot of gas blow-off holes (not shown) in a direction of the heat generator 11, towards the heat generator 11. If necessary, an added gas such as nitrogen, argon, krypton and xenon is mixed with a raw material gas at a predetermined ratio, and a mixed gas can be blown off from the raw material gas blow-off device 12 towards the heat generator 11.

As the raw material gas blow-off device 12 having a lot of gas blow-off holes (not shown) towards the heat generator 11, for example, a tubular shower nozzle having a lot of gas blow-off holes on a peripheral wall, or a hollow plate shaped shower plate having a lot of gas introduction holes on one surface can be adopted in order to allow the raw material gas to contact with the heat generator 11 effectively. Besides them, various forms can be adopted as long as the raw material gas can be allowed to contact with the heat generator 11 effectively.

When a hydrogen gas is adopted as the raw material gas to be supplied from the raw material gas supply system 9, the hydrogen gas is allowed to contact with the heat generator 11 maintained at high temperature, so that hydrogen atoms can be generated by catalyzed degradation.

The heat generator 11 composing the hydrogen atom generation means 2 is disposed in a position opposed to the substrate 5 to be treated held by the substrate holder 4 in the example of the drawing.

The heat generator 11 is not limited as long as it can generate hydrogen atoms from the hydrogen gas by the catalyzed degradation, but metallic catalysts such as tungsten, tantalum, platinum and molybdenum which are generally used as metallic catalysts in a catalytic-CVD (Cat-CVD) apparatus can be used. The metallic catalysts may be used independently, or in combination of two or more thereof simultaneously.

The mode of the heat generator 11 is not particularly limited, but in the case of the catalytic-CVD (Cat-CVD) apparatus, it is desirable that the generated hydrogen atoms effectively contact with the entire surface of the substrate 5 to be treated held by the substrate holder 4.

For example, a lot of tungsten filaments as the heat generator 11 are arranged between the substrate 5 to be treated and the raw material gas blow-off device 12 of a shower nozzle form so as to be approximately parallel with the substrate 5 to be treated. The hydrogen gas from the raw material gas blow-off device 12 contacts with the heat generator 11 so as to become hydrogen atoms, and the hydrogen atoms can be diffused uniformly to the substrate 5 to be treated.

The heat generator 11 is held in the treatment chamber 3 by an electric power introduction terminal, not shown, provided to the treatment chamber 3, and receives electric power from the electric power supply mechanism 10 via the electric power introduction terminal so as to be heated.

In the embodiment shown in the drawing, the treatment chamber 3 is made of stainless steel, and its internal wall surface is coated with an $SiO_2$ film 13.

The coating of the $SiO_2$ film 13 is formed by applying a xylene solution of cold-setting perhydropolysilazane (made by Exousia Inc. (name: QGC Tokyo)) to the internal wall of the treatment chamber 3 made of stainless steel and heating the treatment chamber 3 at 140° C. to 300° C. for three hours. The thickness is not more than 1 μm.

In order to inhibit the attenuation of the density of the hydrogen atoms generated in the treatment chamber 3, the internal wall surface of the passage connected to the pressure reducing means 6 and the internal wall surface of the connecting section 7 are also coated with the $SiO_2$ film 13 similarly.

In the embodiment shown in FIG. 1, the treatment chamber 3 made of stainless steel surrounds the heat generator 11. The heat generator 11 is used as the hydrogen atom generation means. The internal wall surface of the treatment chamber 3 is coated with $SiO_2$. That is to say, the surface of the treatment chamber 3 facing the space in which the heat generator 11 as the hydrogen atom generation means is arranged is coated with $SiO_2$. Thereby, the hydrogen atom generation source in the vacuum treatment apparatus is constituted.

In the embodiment shown in FIG. 1, the entire internal wall surface of the treatment chamber 3 is coated with the $SiO_2$ film 13, but when hydrogen atoms are effectively inhibited from being recombined and returned into hydrogen molecules and the high density of the generated hydrogen atoms can be maintained, only the internal wall surface of an area which encloses the heat generator 11 needs to be coated with the $SiO_2$ film 13.

The generation of hydrogen atoms from the hydrogen atom generation source, the transportation of the generated hydrogen atoms, and a predetermined process using the hydrogen atoms such as the interface stabilizing process for the terminal of a dangling bond in polysilicon and a semiconductor apparatus are executed in the following manner.

The substrate 5 to be treated is carried into the treatment chamber 3 so as to be placed on the substrate holder 4. When the substrate 5 to be treated should be heated, the heating means 8 is operated and heats the substrate holder 4 so as to heat the substrate 5 to be treated to desired temperature such as 20 to 200° C.

A hydrogen gas is supplied from the raw material gas supply system 9 so as to be blown off from the gas blow-off holes of the raw material gas blow-off device 12, and the pressure reducing means 6 is operated so as to reduce the pressure in the treatment chamber 3 to about several Pa to several dozens 10 kPa. Electric power is supplied from the electric power supply system 10 so as to heat the heat generator 11 to predetermined temperature. For example, when the heat generator 11 is tungsten, it is heated to 1000 to 2000° C.

The hydrogen gas blown off from the gas blow-off holes of the raw material gas blow-off device 12 comes in contact with the heated heat generator 11 and catalyzed degradation occurs, so that hydrogen atoms are generated. The hydrogen atoms contact the substrate 5 to be treated held by the substrate holder 4, so that the interface stabilizing process is executed on the terminal of a dangling bond in polysilicon and a semiconductor apparatus.

Since the internal wall of the treatment chamber 3 is coated with the $SiO_2$ film 13, the hydrogen atoms, which are generated by decomposing the hydrogen molecules, can be inhibited effectively from being recombined and returned into the hydrogen molecules on the surface of the high-temperature heat generator 11 (metallic catalyst) as described before. In such a manner, the desired process can be executed by the hydrogen atoms with high density.

The treatment chamber 3 made of stainless steel can be cooled by annexing a water cooling system 15. While the hydrogen atoms are being generated, the treatment chamber 3 is being cooled, so that the attenuation of the hydrogen atom density can be inhibited more effectively.

Figure 2:
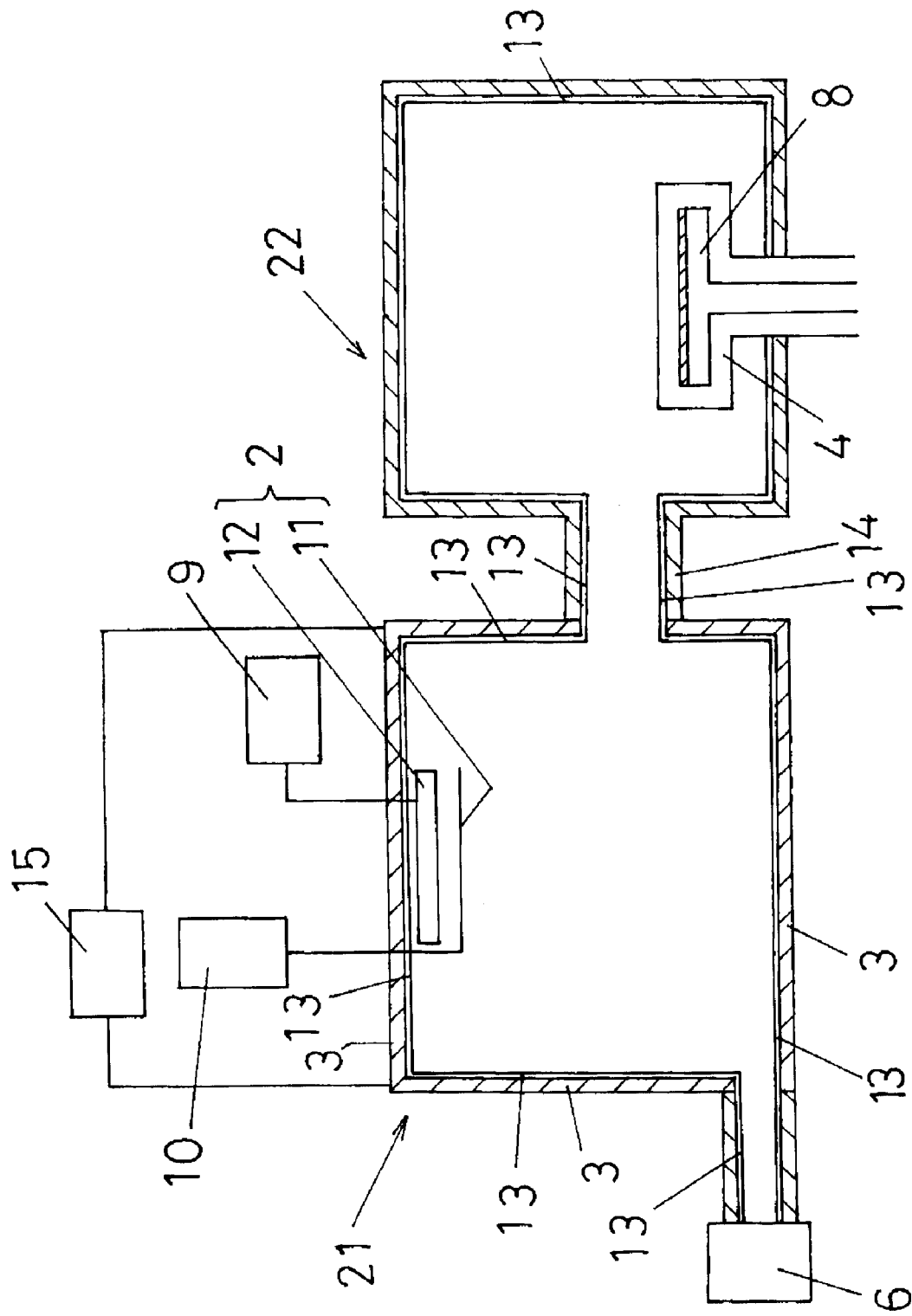
FIG. 2 is a schematic constitutional diagram explaining another embodiment of the present invention.

FIG. 2 describes another embodiment. In FIG. 2, a reference numeral 21 corresponds to the hydrogen atom generation source of the present invention. That is to say, the treatment chamber 3 is not a machine which executes a desired process on the substrate to be treated therein, but is a machine which generates hydrogen atoms and transports the generated hydrogen atoms via a transport passage 14 to the treatment chamber in which the desired process is executed on the substrate to be treated therein shown by a reference numeral 22 in FIG. 2. Therefore, the internal wall of the transport passage 14 is also coated with the $SiO_2$ film 13 similarly to the internal wall of the treatment chamber 3.

Since the constitution and the operation of the embodiment shown in FIG. 2 are the same as those in the embodiment shown in FIG. 1 except that the substrate holder described in the embodiment shown in FIG. 1 is not provided into the hydrogen atom generation source 21, common components are designated by common symbols, and the description thereof is not repeated.

In the embodiments shown in FIGS. 1 and 2, hydrogen atoms are generated by decomposing hydrogen molecules on the surface of the metallic catalyst (heat generator 11) of the catalytic-CVD apparatus whose temperature is maintained high, but catalytic decomposition of ammonia can be used. Further, other various modes can be adopted as the hydrogen atom generation means.

Hydrogen atoms with high density can be generated by microwave discharge. Since a lot of hydrogen atoms cannot be generated unless discharge capacity is increased, hydrogen molecules are decomposed on the surface of the high-temperature metallic catalyst described in the above embodiment, so that hydrogen atoms are generated more efficiently.

According to experiments by the inventors, a hydrogen gas is introduced into the treatment chamber 3 which is maintained at 5.6 Pa, and hydrogen atoms are generated by using the tungsten filaments heated to 1900° C. as the metallic catalyst. The density of the hydrogen atoms is $10^{14}/cm^3$ in a place 10 cm below the tungsten filaments. It is confirmed that when the heating temperature of the tungsten is raised to 2100 to 2300° C. and the pressure in the treatment chamber 3 is set to 0.1 to 10 kPa, hydrogen atoms in an amount of one digit larger can be generated.

Like the embodiment shown in FIG. 1, the heat generator 11 which is the metallic catalyst of the catalytic-CVD apparatus is adopted as the hydrogen atom generation means, and the surface which faces the space with the heat generator 11 formed therein of the treatment chamber 3 made of stainless steel which surrounds the heat generator 11, namely, the internal wall surface of the treatment chamber 3 is coated with $SiO_2$, so that the hydrogen atom generation source is formed.

As a result, while the high density of the generated many hydrogen atoms is being maintained, the interface stabilizing process can be executed on the terminal of a dangling bond in polysilicon and the semiconductor apparatus efficiently in the catalytic-CVD apparatus.

EXAMPLE

The following experiment is carried out on the hydrogen atom generation source in the vacuum treatment and the hydrogen atom transport method of an embodiment of the present invention.

A cylindrical treatment chamber made of stainless steel (inner diameter: 27 mm, height: 280 mm) is prepared.

The treatment chamber is a cooling jacket connected to the water cooling system and can be evacuated by a turbo molecule pump, and a hydrogen gas can be introduced into an upper side of the treatment chamber.

Tungsten filament (length: 20 cm, diameter: 0.4 mm), which is supplied with electric power from the outside so as to be heated to high temperature, is arranged on a portion to which the hydrogen gas introduced into the treatment chamber is blown off.

Four treatment chambers are prepared, the internal wall surface of one chamber is not coated, and the internal wall surface of one of the residual chambers is coated with fluorine resin; the internal wall surface of another residual chamber is coated with $SiO_2$; and the internal wall surface of the other residual chamber is coated with fluorine resin and thereafter an $H_3PO_4$ solution is sprayed, so that it is coated.

Unics Co. carries out the fluorine resin coating using teflon (registered trade mark) so that the treatment chambers have thickness of 30 μm.

The $SiO_2$ film coating is formed in a manner that a xylene solution of cold-setting perhydropolysilazane (made by Exousia Inc. (name: QGC Tokyo)) is applied to the internal wall of the treatment chambers made of stainless steel, and the treatment chambers are heated at 140° C. to 300° C. for three hours. The thickness of the $SiO_2$ film is 1 μm or less.

The internal wall surface which is coated with the $SiO_2$ film, and an $H_3PO_4$ solution is sprayed thereto so that the internal wall surface is coated is prepared as follows: an $H_3PO_4$ solution is sprayed onto the $SiO_2$ film formed in the above manner, and the internal wall surface is dried.

The temperature of the internal walls of the treatment chambers are maintained at 20° C. by the water cooling system, the pressure in the treatment chambers is maintained at 8.0 Pa, and the flow rate of the hydrogen gas is maintained at 0.15 SLM (standard liters/minute). The temperature of the tungsten filament is changed within a range of 1100° C. to 2000° C., and an absolute density of the hydrogen atoms is measured in a vacuum ultraviolet portion (121.6 nm) by a absorptiometric method.

Figure 3:
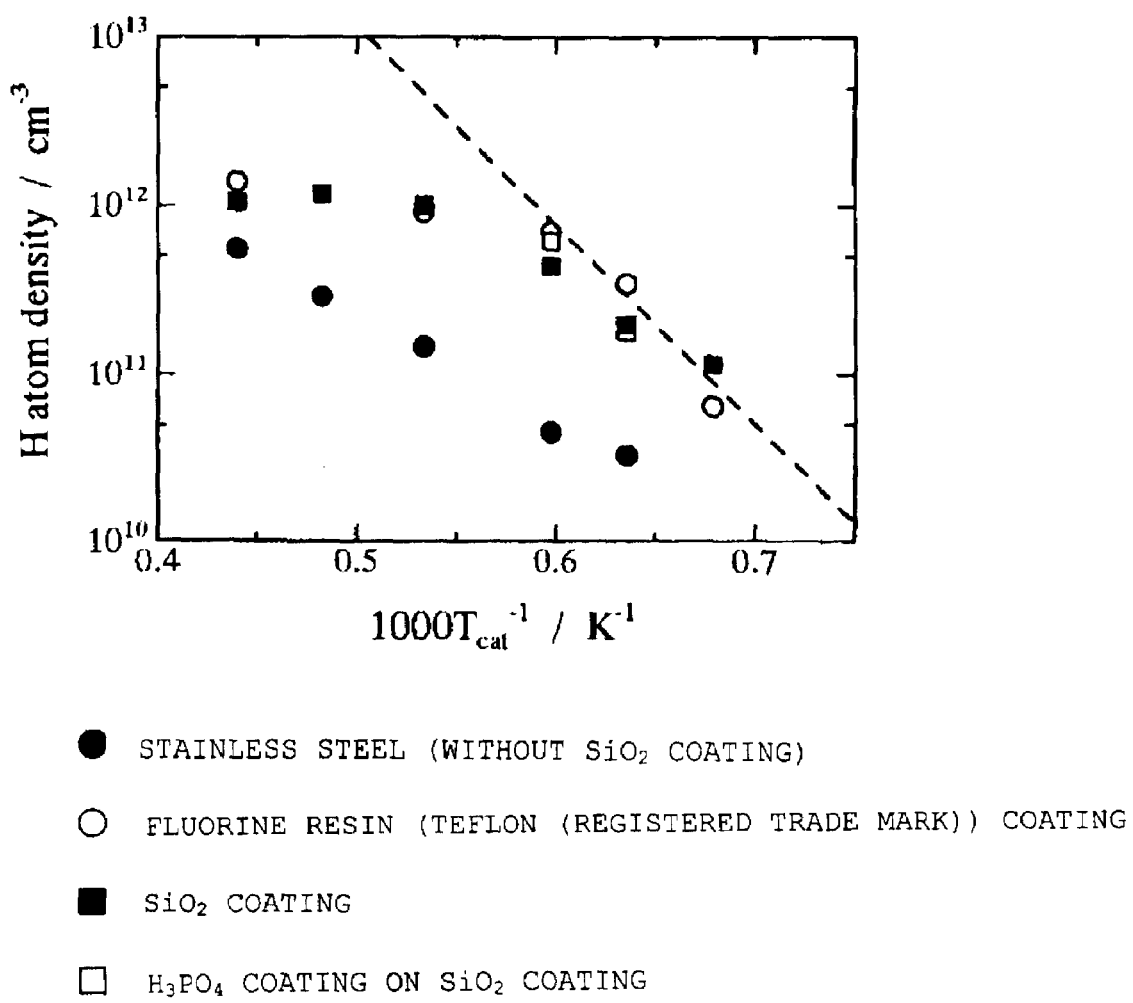
FIG. 3 is a diagram illustrating experimental results of embodiments of the present invention.

The measured results are shown in FIG. 3. In FIG. 3, an inverse number of the absolute temperature of the tungsten filament is plotted along an abscissa axis and the hydrogen atom density is plotted along an ordinate axis as logarithm and each of the following cases is shown: in the case where the internal wall of the treatment chamber made of stainless steel is not coated; in the case where the internal wall is coated with fluorine resin of teflon (registered trade mark); in the case where the internal wall is coated with $SiO_2$; and in the case where the internal wall coated with $SiO_2$ is further coated with $H_3PO_4$.

As a result of the experiment, a comparison is made among the case where the internal wall of the treatment chamber made of stainless steel is coated with fluorine resin, the case where the internal line is coated with $SiO_2$, and the case where the internal wall is not coated at the absolute temperature of one tungsten filament. As shown in FIG. 3, also at the absolute temperature of all the tungsten filaments, the hydrogen atom density in the cases where the internal wall is coated with fluorine resin and $SiO_2$ is higher than that in the case where the internal wall is not coated. It is confirmed that a temperature area is present where a difference in the hydrogen atom density is a single (or more) exponential digit (FIG. 3). For example, at one temperature, the H atom density changes from $10^{11}$ to $10^{12}$.

In the present invention, instead of the coating with the $SiO_2$ film, the coating with fluorine resin using teflon (registered trade mark) can be adopted. Since it is, however, not easy to coat the internal wall of the practically usable treatment chamber with fluorine resin using teflon (registered trade mark), the coating with the $SiO_2$ film is practically desirable.

Even the case where the $SiO_2$ film-coated internal wall is coated with $H_3PO_4$ is not particularly different from the case where the internal wall of the treatment chamber made of stainless steel is coated only with the $SiO_2$ film.

In FIG. 3, a broken line expresses a measured result in the case where the inventors of the present invention conducts the similar experiment using the cylindrical treatment chamber made of stainless steel (the water cooling system similar to this experimental example) whose inner diameter is 460 mm and height is 320 mm. The hydrogen atom density (expressed by logarithm) and the absolute temperature (inverse number) of the tungsten filament shown by the broken line in FIG. 3 are expressed in the case where the length of the tungsten filament: 120 cm and the pressure in the treatment chamber: 5.6 Pa are corrected according to conditions of this experiment conducted in this large treatment chamber.

In FIG. 3, the logarithm of the hydrogen atom density is plotted along the ordinate axis and the inverse number of the absolute temperature of the tungsten filament is plotted along the abscissa axis, but in the case of the experiment in the large treatment chamber, both the logarithm and the inverse number are in a linear relationship even at 1900° C. or more. When the result of the experiment in the treatment chamber (inner diameter: 72 mm) used in this experimental example is compared with the result of the experiment in the aforementioned large treatment chamber (inner diameter: 460 mm), an influence of recombining of the hydrogen atoms and their returning into hydrogen molecules can be considered to be small on the internal wall surface of the large treatment chamber, because of the size of the inner diameter which is larger than the inner diameter of the treatment chamber used in this experimental example.

In this experimental example, the experiment is carried out under conditions that the temperature of a cooling medium in the water cooling system is maintained at 20° C. and the temperature of the tungsten filament is set to 1400° C. The hydrogen atom density is $4.4 \times 10^{11}/cm^3$. On the other hand, under the same conditions except that the water cooling system is not operated, the hydrogen atom density is reduced to $3.3 \times 10^{11}/cm^3$. It is, therefore, desirable for effectively inhibiting the hydrogen atoms from being recombined and returned into hydrogen molecules on the internal wall surface of the treatment chamber to use the water cooling chamber and set the temperature of the internal wall to a lower value In this experiment, even when the temperature of the internal wall in the treatment chamber is changed within a range from +30° C. to −30° C., the hydrogen atom density is not greatly changed. However, when the temperature of the internal wall in the treatment chamber exceeds +30° C., the hydrogen atom density reduces.

In this experimental example, in the case where the internal wall of the treatment chamber made of stainless steel is coated with the $SiO_2$ film, the temperature of the tungsten filament is set to 2000° C., the pressure in the treatment chamber is set to 8.0 Pa, and the internal wall surface of the treatment chamber is exposed with the hydrogen atoms for 5 hours. The hydrogen atom density does not change.

After the experiment is carried out, a measurement is made on the internal wall of the treatment chamber made of stainless steel which is coated with the $SiO_2$ film by mass spectrometry in order to examine presence/non-presence of etching of the $SiO_2$ film by means of the hydrogen atoms. A measurement is made whether $SiH_4$ and $H_2O$ can be detected using a mass spectrometer (M-QA200TS made by ANELVA CORPORATION). As a result, $SiH_4$ is not detected. Although $H_2O$ is detected, its signal intensity is not different from the intensity of a signal present as a background, and thus the etching of $SiO_2$ is not confirmed.

Figure 4A:
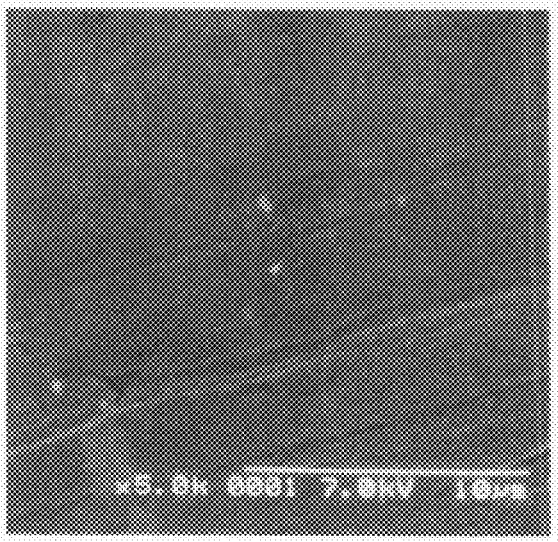
FIG. 4(a) is the SEM image of the $SiO_2$ film surface before the experiment.
Figure 4B:
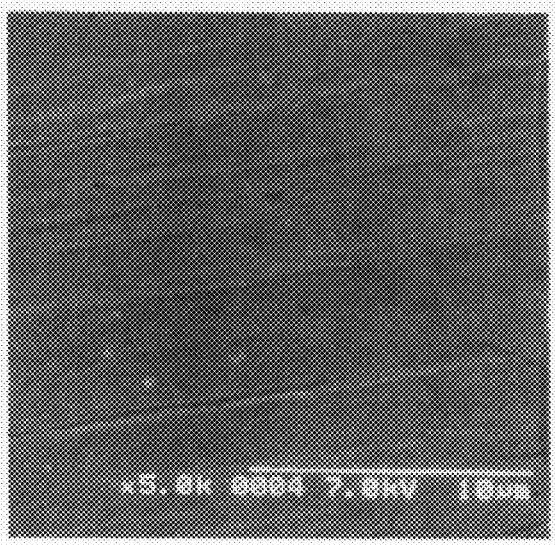
FIG. 4(b) is the SEM image of the $SiO_2$ film surface after the experiment.

An SEM image of the $SiO_2$ film surface on the inner surface of the treatment chamber made of stainless steel is examined before and after the experiment. FIG. 4(a) is the SEM image of the $SiO_2$ film surface before the experiment, and FIG. 4(b) is the SEM image of the $SiO_2$ film surface after the experiment. The time for which the $SiO_2$ film surface is exposed with the hydrogen atoms is 3 hours, and the hydrogen atom density for this time is $1.0 \times 10^{12}/cm^3$. In FIGS. 4(a) and 4(b), surface roughness is caused by roughness of the internal wall of the treatment chamber made of stainless steel. As is evident from FIGS. 4(a) and 4(b), a difference caused by the results of the etching using the hydrogen atoms is very small therebetween.

According to the disclosed hydrogen atom generation source and the disclosed hydrogen atom transportation method, the attenuation of the density of the generated hydrogen atoms can be effectively inhibited, and a large amount of the hydrogen atoms with high density can be transported to a target place.

The hydrogen atoms can be used for improving the property of a semiconductor thin film surface and removing photoresist in manufacturing of a semiconductor using the vacuum treatment apparatus. A technique which after transporting hydrogen atoms generated a lot on a heating catalyst in the Cat-CVD apparatus, reacts them with silane and deposits generated silyl radical so as to manufacture an amorphous silicon thin film with less defect, a plasma-resist peeling technique (TECHNICAL REPORT OF IEICE CPM 2004-134 (2004-11) 39 to 43 pages, the INSTITUTE OF ELECTRONICS, INFORMATION AND COMMUNICATION ENGINEERS) using high-density hydrogen atoms generated a lot on the heating catalyst in the Cat-CVD apparatus, and an interface stabilizing technique for a semiconductor apparatus using hydrogen radical or deuterium radical on a heating catalyst in the Cat-CVD apparatus (Japanese Patent Application Laid-Open No. 2004-319771) are proposed.

The present invention, which can effectively inhibit the attenuation of the density of the hydrogen atoms generated by the hydrogen atom generation means, and can transport a lot of hydrogen atoms with high density to a desired place, can be applied to these various techniques.

Furthermore, the invention is not restricted to the above-mentioned illustrative embodiments, but is, of course, applicable to other embodiments within the scope of the following patent claims.

The invention claimed is:

1. A vacuum treatment apparatus comprising:
   a hydrogen atom generation means, and
   an internal wall surface surrounding said hydrogen atom generation means, the internal wall surface being made of metal;
   wherein at least a part of the internal wall surface facing a space in which said hydrogen atom generation means is arranged is coated with $SiO_2$, and the coated $SiO_2$ is coated with $H_3PO_4$.

2. A hydrogen atom transportation method in a vacuum treatment apparatus for transporting hydrogen atoms generated by a hydrogen atom generation means in a vacuum treatment apparatus to a desired place, wherein the hydrogen atoms are transported via a transport passage whose internal wall surface is coated with $SiO_2$,
   at least a part of an internal wall surface of the vacuum treatment apparatus facing a space in which said hydrogen atom generation means is arranged is coated with $SiO_2$, the internal wall surface surrounding said hydrogen atom generation means, and the internal wall surface being made of metal, and the coated $SiO_2$ is coated with $H_3PO_4$.

* * * * *